US008890984B2

(12) United States Patent
Konno et al.

(10) Patent No.: US 8,890,984 B2
(45) Date of Patent: Nov. 18, 2014

(54) SOLID-STATE IMAGING ELEMENT

(75) Inventors: Yusaku Konno, Kanagawa-ken (JP);
Naotada Okada, Kanagawa-ken (JP);
Koichi Kokubun, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/585,113

(22) Filed: Aug. 14, 2012

(65) Prior Publication Data
US 2013/0057738 A1 Mar. 7, 2013

(30) Foreign Application Priority Data
Sep. 2, 2011 (JP) .................. 2011-191903

(51) Int. Cl.
H04N 3/14 (2006.01)
G02B 5/20 (2006.01)
H01L 27/146 (2006.01)
H04N 9/04 (2006.01)

(52) U.S. Cl.
CPC .......... *H01L 27/14621* (2013.01); *G02B 5/203* (2013.01); *G02B 5/201* (2013.01); *H04N 9/045* (2013.01)
USPC ............................ 348/274; 348/272; 348/294

(58) Field of Classification Search
USPC .................... 348/272–280, 294–308
See application file for complete search history.

(56) References Cited

U.S. PATENT DOCUMENTS

| 7,420,610 | B2 * | 9/2008 | Orita et al. ............... 348/340 |
| 2006/0164720 | A1 * | 7/2006 | Yoshida et al. ........... 359/359 |
| 2006/0205107 | A1 * | 9/2006 | Inaba et al. ................ 438/57 |
| 2007/0058055 | A1 * | 3/2007 | Yamaguchi et al. ....... 348/272 |
| 2007/0235756 | A1 * | 10/2007 | Kato ......................... 257/184 |
| 2008/0251873 | A1 * | 10/2008 | Kasano et al. ............. 257/432 |
| 2009/0039340 | A1 * | 2/2009 | Toda ........................... 257/21 |
| 2011/0043823 | A1 * | 2/2011 | Hillmer et al. ............ 356/519 |
| 2011/0128423 | A1 * | 6/2011 | Lee et al. ................... 348/294 |

FOREIGN PATENT DOCUMENTS

| JP | 2008-170979 A | 7/2008 |
| JP | 2010-225944 A | 10/2010 |

* cited by examiner

*Primary Examiner* — Tuan Ho
*Assistant Examiner* — Selam Gebriel
(74) *Attorney, Agent, or Firm* — Oblon, Spivak, McClelland, Maier & Neustadt, L.L.P.

(57) ABSTRACT

According to one embodiment, a solid-state imaging element includes a substrate, and a plurality of color filters. A plurality of photoelectric conversion units is provided in the substrate. The plurality of color filters is provided respectively for the plurality of photoelectric conversion units. The plurality of color filters is configured to selectively transmit light of a designated wavelength band. Each of the plurality of color filters includes a stacked structure unit and a periodic structure unit. A plurality of layers having different refractive indexes is stacked in the stacked structure unit. A plurality of components is provided in the periodic structure unit at different periods according to the designated wavelength band and an incident angle of the light.

20 Claims, 12 Drawing Sheets

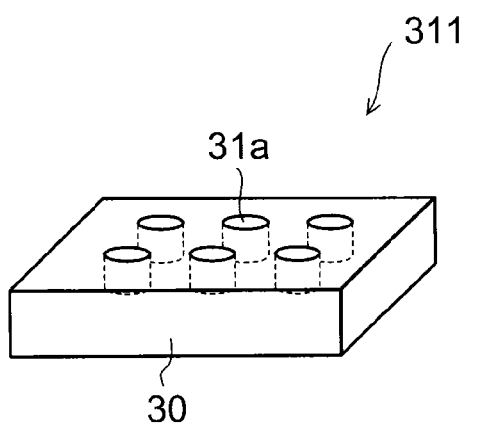
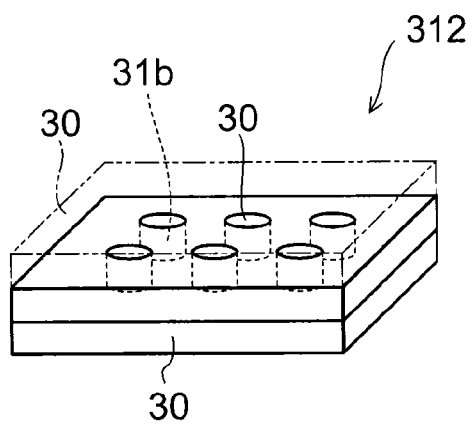
FIG. 2A   FIG. 2B
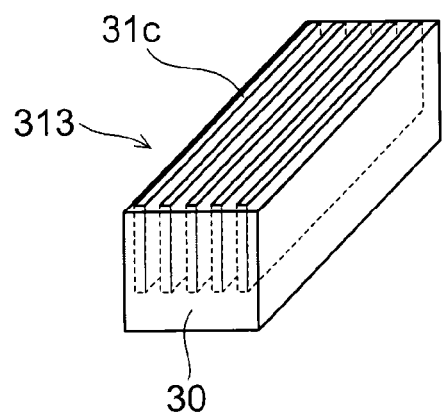
FIG. 2C

SOLID-STATE IMAGING ELEMENT

CROSS-REFERENCE TO RELATED APPLICATIONS

This application is based upon and claims the benefit of priority from the prior Japanese Patent Application No. 2011-191903, filed on Sep. 2, 2011; the entire contents of which are incorporated herein by reference.

FIELD

Embodiments described herein relate generally to a solid-state imaging element.

BACKGROUND

In recent years, the range of applications of solid-state imaging elements has spread to an extensive range including digital cameras, various mobile terminals such as mobile telephones and the like, surveillance cameras, web cameras for chatting via the internet, etc.

There are cases where a photonic color filter that uses an inorganic material is used in such a solid-state imaging element.

By using photonic color filters (called simply color filters hereinbelow), downscaled and thinner pixels are possible.

However, color shift undesirably increases as the angle of the light that is incident increases.

BRIEF DESCRIPTION OF THE DRAWINGS

FIGS. 2A to 2C are schematic perspective views illustrating periodic structure units.

DETAILED DESCRIPTION

Figure 1:
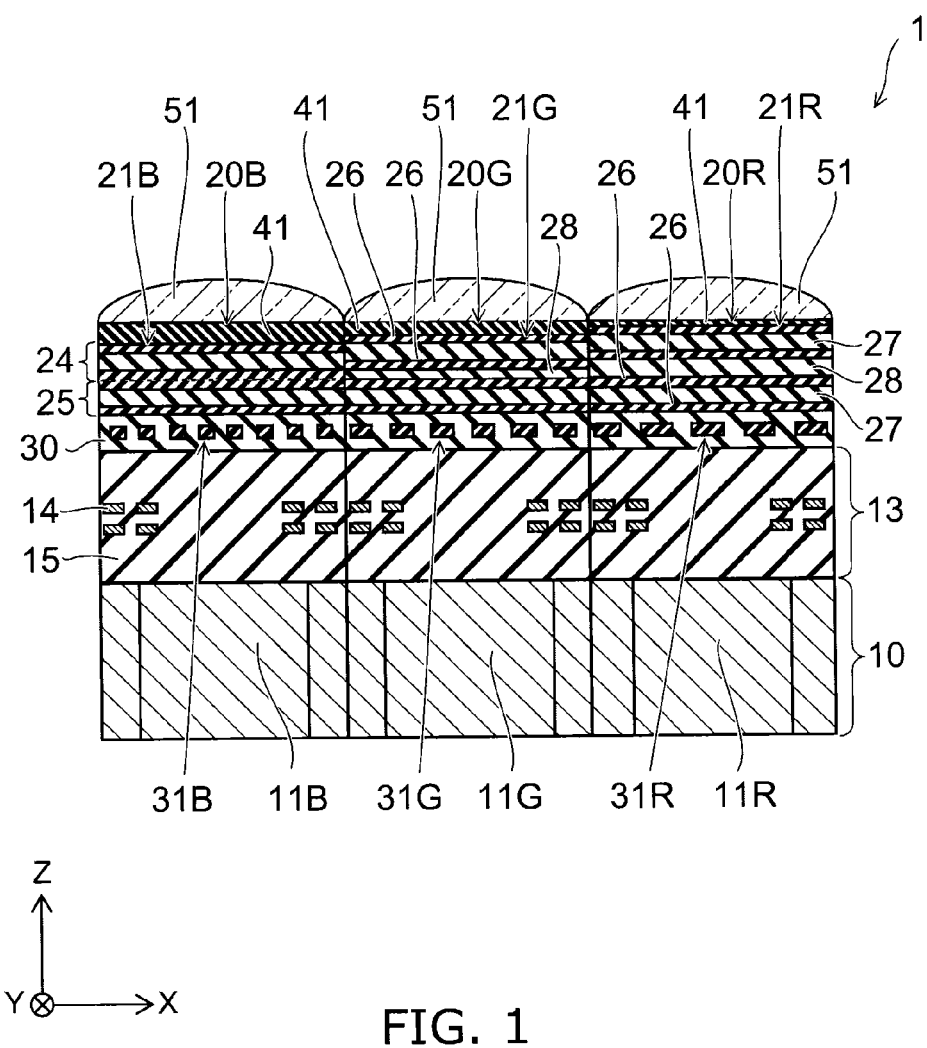
FIG. 1 is a schematic cross-sectional view illustrating a solid-state imaging element according to an embodiment.

In general, according to one embodiment, a solid-state imaging element includes a substrate, and a plurality of color filters. A plurality of photoelectric conversion units is provided in the substrate. The plurality of color filters is provided respectively for the plurality of photoelectric conversion units. The plurality of color filters is configured to selectively transmit light of a designated wavelength band. Each of the plurality of color filters includes a stacked structure unit and a periodic structure unit. A plurality of layers having different refractive indexes is stacked in the stacked structure unit. A plurality of components is provided in the periodic structure unit at different periods according to the designated wavelength band and an incident angle of the light.

Embodiments will now be illustrated with reference to the drawings. Similar components in the drawings are marked with like reference numerals, and a detailed description is omitted as appropriate.

An X direction, a Y direction, and a Z direction illustrated in the drawings illustrate mutually orthogonal directions. The X direction and the Y direction illustrate directions parallel to a major surface of a substrate 10; and the Z direction illustrates a direction (a stacking direction) perpendicular to the major surface of the substrate 10.

Further, being viewed from a direction perpendicular to the major surface of the substrate 10 is referred to as being viewed in plan.

FIG. 1 is a schematic cross-sectional view illustrating a solid-state imaging element according to an embodiment.

As illustrated in FIG. 1, the substrate 10, an interconnect unit 13, color filters 20B, 20G, and 20R, and microlenses 51 are provided in the solid-state imaging element 1.

For example, the substrate 10 may be a silicon substrate. The substrate 10 has a pixel region, and a not-illustrated peripheral circuit region that is formed in a periphery of the pixel region.

FIG. 1 is a cross section of one pixel of the pixel region.

Multiple photoelectric conversion units are provided in the substrate 10.

In other words, photodiodes 11B, 11G, and 11R are provided as the photoelectric conversion units in the pixel region of the substrate 10. When the front surface of the substrate 10 is viewed from the incident direction of the light, the multiple photodiodes 11B, the multiple photodiodes 11G, and the multiple photodiodes 11R may be two-dimensionally arranged in a matrix configuration (a chessboard-like configuration, a honeycomb configuration, etc.). For example, the planar configurations of the photodiodes 11B, 11G, and 11R may be squares. The photodiodes 11B, 11G, and 11R may include pn junctions.

For example, one set of the photodiodes 11B, 11G, and 11R corresponds to one pixel. The wavelength band of the light that is received is different between the photodiodes 11B, 11G, and 11R due to effects of the color filters 20B, 20G, and 20R described below. For example, the photodiode 11B receives light of a blue band; the photodiode 11G receives light of a green band; and the photodiode 11R receives light of a red band.

Transistors included in a signal processing circuit, a drive control circuit, etc., are provided in the not-illustrated peripheral circuit region of the substrate 10. The signal processing circuit processes electrical signals (pixel signals) output by the photoelectric conversions of the photodiodes 11B, 11G, and 11R. The drive control circuit controls the driving of the photodiodes 11B, 11G, and 11R.

The interconnect unit 13 is provided on the substrate 10. The interconnect unit 13 includes interconnects 14 and an inter-layer insulating film 15. Multiple layers of the interconnects 14 may be provided (although there are two layers in FIG. 1, this is not limited thereto). The interconnects 14 may be a single layer. The inter-layer insulating film 15 is provided between the interconnects 14, between the substrate 10 and the interconnects 14 of the lowermost layer, and between the interconnects 14 of the uppermost layer and the color filters 20B, 20G, and 20R.

The interconnects 14 electrically connect the photodiodes 11B, 11G, and 11R to the peripheral circuit. For example, a refractory metal such as copper (Cu), titanium (Ti), molybdenum (Mo), tungsten (W), and the like, or a silicide of a refractory metal such as TiSi, MoSi, WSi, and the like may be used as the material of the interconnects 14. For example, silicon oxide ($SiO_2$) may be used as the material of the inter-layer insulating film 15.

Because the interconnects 14 are made of a metal material, etc., and are light-shielding bodies, the interconnects 14 are not provided at positions that shield the light from being incident on the light reception regions of the photodiodes 11B, 11G, and 11R. Other than the interconnects 14, a light-shielding film or transfer electrodes to not-illustrated charge transfer units may be provided inside the interconnect unit 13.

The color filters 20B, 20G, and 20R are provided on the interconnect unit 13. The color filter 20B is provided above the photodiode 11B and transmits light of a designated wavelength band (the blue band) toward the photodiode 11B. The color filter 20G is provided above the photodiode 11G and transmits light of a designated wavelength band (the green band) toward the photodiode 11G. The color filter 20R is provided above the photodiode 11R and transmits light of a designated wavelength band (the red band) toward the photodiode 11R.

In other words, the color filters 20B, 20G, and 20R are provided respectively for the multiple photodiodes 11B, 11G, and 11R and selectively transmit the light of the designated wavelength bands.

An inter-layer film 41 is provided on the color filters 20B, 20G, and 20R. Because the thicknesses of the color filters 20B, 20G, and 20R are different, the inter-layer film 41 is provided such that the upper surface does not have a difference in levels. The upper surface of the inter-layer film 41 is a flat surface; and the microlenses 51 are provided on the upper surface of the inter-layer film 41.

The microlenses 51 are provided respectively on the color filters 20B, 20G, and 20R.

For example, the microlenses 51 may be convex lenses; and the incident light may be concentrated by the microlenses 51. The incident light concentrated by the microlenses 51 is separated by the color filters 20B, 20G, and 20R and is incident on the photodiodes 11B, 11G, and 11R.

Photoelectric conversion of the light incident on the photodiodes 11B, 11G, and 11R is performed. The electrical signals (the pixel signals) generated by the photoelectric conversion are transmitted to the not-illustrated peripheral circuit via the interconnects 14, etc.

The color filters 20B, 20G, and 20R will now be illustrated further.

The color filters 20B, 20G, and 20R include stacked structure units 21B, 21G, and 21R and periodic structure units 31B, 31G, and 31R, where layers having different refractive indexes are stacked in the stacked structure units 21B, 21G, and 21R, and multiple components are provided in the periodic structure units 31B, 31G, and 31R at different periods according to the designated wavelength band and the incident angle of the light.

The color filter 20B includes the stacked structure unit 21B and the periodic structure unit 31B. The color filter 20G includes the stacked structure unit 21G and the periodic structure unit 31G. The color filter 20R includes the stacked structure unit 21R and the periodic structure unit 31R.

The periodic structure unit 31B is provided on the interconnect unit 13 above the photodiode 11B. The periodic structure unit 31G is provided on the interconnect unit 13 above the photodiode 11G. The periodic structure unit 31R is provided on the interconnect unit 13 above the photodiode 11R.

The stacked structure unit 21B is provided on the periodic structure unit 31B. The stacked structure unit 21G is provided on the periodic structure unit 31G. The stacked structure unit 21R is provided on the periodic structure unit 31R.

The stacked structure units 21B, 21G, and 21R include an upper mirror layer 24 and a lower mirror layer 25. The structure of the upper mirror layer 24 and the lower mirror layer 25 is symmetric in the stacking direction.

The upper mirror layer 24 and the lower mirror layer 25 have stacked structures of a first layer 26 and a second layer 27 which have relatively different refractive indexes. The refractive index of the first layer 26 is higher than that of the second layer 27. The number of stacks of the first layer 26 and the second layer 27 may be any number.

A control layer 28 is provided between the upper mirror layer 24 and the lower mirror layer 25. The thickness of the control layer 28 is different for each of the transmitted wavelengths; or the refractive index of the control layer 28 is different for each of the transmitted wavelengths. In the case where the thickness of the control layer 28 is zero, that is, in the case where the control layer 28 is not provided as in the color filter 20B of FIG. 1, the stacked body made of the adjacent first layers 26 at the boundary between the upper mirror layer 24 and the lower mirror layer 25 functions as the control layer.

The upper mirror layer 24 and the lower mirror layer 25 function as a dielectric multilayer mirror in which the reflective surfaces oppose each other. A film thickness D of the first layer 26 and the second layer 27 may be specified by the following Formula (1).

$$D=\lambda/(4\times n) \quad (1)$$

where D is the film thickness of the first layer 26 or the second layer 27, $\lambda$ is, for example, the center wavelength of the visible region (e.g., 550 nm), and n is the refractive index of the first layer 26 or the second layer 27. The film thicknesses of the layers may be different from the values determined using Formula (1) to optimize the transmission characteristics.

The control layer 28 is provided between the upper mirror layer 24 and the lower mirror layer 25. It is possible to transmit only the designated wavelength of the light undergoing multiple reflections at the reflective surfaces of the upper mirror layer 24 and the lower mirror layer 25 by appropriately designing the thickness and the refractive index of the control layer 28. In other words, in the stacked structure units 21B, 21G, and 21R, the transmitted wavelengths can be specified based on the same principle as a Fabry-Perot interferometer.

The first layer 26, the second layer 27, and the control layer 28 may be formed from inorganic materials. For example, the materials of the first layer 26, the second layer 27, and the control layer 28 may be titanium oxide ($TiO_2$), silicon oxide ($SiO_2$), silicon nitride (SiN), silicon (Si), polycrystalline silicon, amorphous silicon, etc.

The periodic structure units 31B, 31G, and 31R include multiple components and a foundation layer 30 which has a refractive index lower than that of the components which are described below. The multiple components are provided inside the foundation layer 30.

The foundation layer 30 and the components may be formed from inorganic materials. For example, the materials of the foundation layer 30 and the components may be silicon (Si), polycrystalline silicon, silicon oxide ($SiO_2$), etc.

FIGS. 2A to 2C are schematic perspective views illustrating periodic structure units.

FIG. 2A is the case where the periodic structure unit includes multiple components having dot configurations; FIG. 2B is the case where the periodic structure unit includes multiple components having hole configurations; and FIG. 2C is the case where the periodic structure unit includes multiple components having stripe configurations (line configurations).

As illustrated in FIG. 2A, a periodic structure unit 311 may include multiple components having dot configurations. In such a case, the periodic structure unit 311 may include multiple components 31a having circular columnar configurations disposed periodically. The periodic structure unit 311 in which the multiple components 31a having circular columnar configurations are disposed periodically corresponds to the periodic structure units 31B, 31G, and 31R described above.

As illustrated in FIG. 2B, a periodic structure unit 312 may include multiple components having hole configurations. In such a case, the periodic structure unit 312 may include multiple components 31b having hole configurations disposed periodically. The periodic structure unit 312 in which the multiple components 31b having hole configurations are disposed periodically corresponds to the periodic structure units 31B, 31G, and 31R described above. The foundation layer 30 may be filled into the interiors of the multiple components 31b having hole configurations.

As illustrated in FIG. 2C, a periodic structure unit 313 may include multiple components having stripe configurations. In such a case, the periodic structure unit 313 may include multiple components 31c having stripe configurations disposed periodically. The periodic structure unit 313 in which the multiple components 31c having stripe configurations are disposed periodically corresponds to the periodic structure units 31B, 31G, and 31R described above.

The multiple components provided in the periodic structure units 31B, 31G, and 31R have designated periodicities for the transmitted wavelengths. In other words, the multiple components are provided in the periodic structure units 31B, 31G, and 31R at different periods according to the designated wavelength bands.

In such a case, the light other than the designated wavelength bands (the light of wavelength bands not to be guided into the photodiodes) can be reflected and absorbed by appropriately designing the periods of the multiple components of the periodic structure units 31B, 31G, and 31R.

For example, the optical reflectance and the absorptance of the green band and the red band are high for the periodic structure unit 31B. The optical reflectance and the absorptance of the blue band and the red band are high for the periodic structure unit 31G. The optical reflectance and the absorptance of the blue band and the green band are high for the periodic structure unit 31R.

Due to the synergistic effect of the stacked structure units 21B, 21G, and 21R and the periodic structure units 31B, 31G, and 31R, the transmission spectra of the color filters 20B, 20G, and 20R can be controlled to have the desired characteristics.

However, according to knowledge obtained by the inventors, it was ascertained that the transmission spectra of the color filters 20B, 20G, and 20R change as the angle of the light that is incident changes.

Figure 3A:
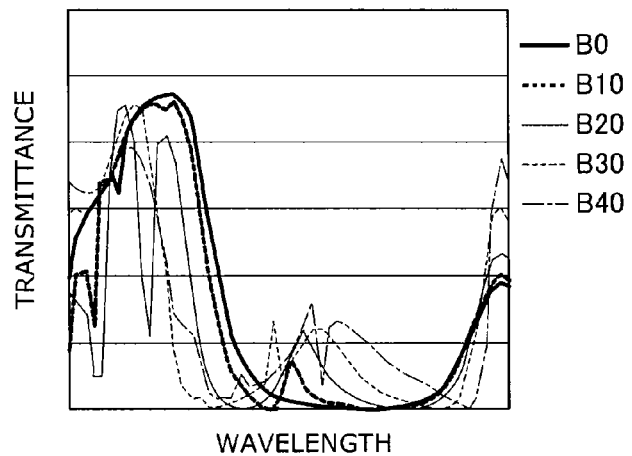
FIGS. 3A to 3C are schematic graphs illustrating the effects of an incident angle θ of the light on the characteristics of the color filters.
Figure 3B:
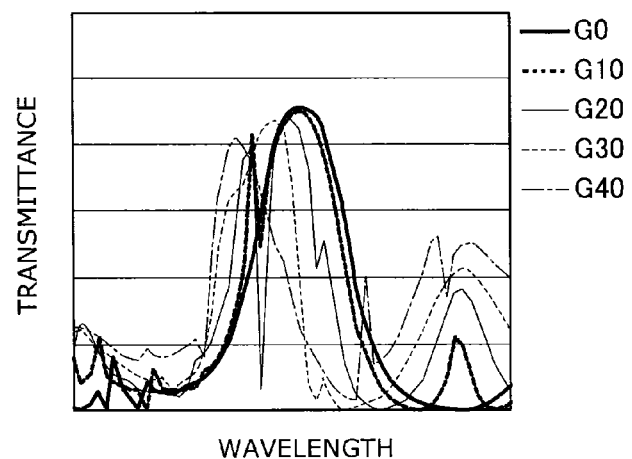
Figure 3C:
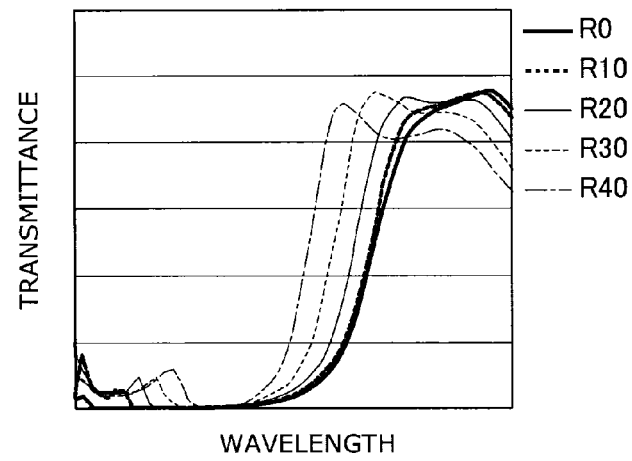

FIGS. 3A to 3C are schematic graphs illustrating the effects of an incident angle θ of the light on the characteristics of the color filters. FIG. 3A is the case of the light of the blue band; FIG. 3B is the case of the light of the green band; and FIG. 3C is the case of the light of the red band.

B0, G0, and R0 are the case where the incident angle θ is 0°; B10, G10, and R10 are the case where the incident angle θ is 10° B20, G20, and R20 are the case where the incident angle θ is 20°; B30, G30, and R30 are the case where the incident angle θ is 30°; and B40, G40, and R40 are the case where the incident angle θ is 40°.

The incident angle θ is the angle between a direction (the Z direction) perpendicular to the major surface of the substrate 10 and the direction of the incident light. For example, in the case where the incident angle θ is 0°, the light is incident from a direction perpendicular to the major surface of the substrate 10.

The transmittance was determined by a simulation using RCWA (Rigorous Coupled Wave Analysis).

As illustrated in FIGS. 3A to 3C, the wavelength at which the transmittance is a maximum changes as the incident angle θ of the light changes. In other words, color shift occurs as the incident angle θ of the light changes. This becomes pronounced as the incident angle θ increases.

Therefore, the multiple components are provided in the periodic structure units 31B, 31G, and 31R at different periods according to the incident angle of the light.

For example, the incident angle of the light that is incident on a region on the circumferential edge side of the substrate 10 (corresponding to an example of the second region) is greater than the incident angle of the light that is incident on a region on the central side of the substrate 10 (corresponding to an example of the first region). Therefore, the periodicities of the multiple components of the periodic structure units 31B, 31G, and 31R provided above the region on the central side of the substrate 10 are different from the periodicities of the multiple components of the periodic structure units 31B, 31G, and 31R provided above the region on the circumferential edge side of the substrate 10.

In such a case, the periods of the multiple components provided above the region on the circumferential edge side of the substrate 10, for which the incident angle of the light is greater than that of the region on the central side of the substrate 10, are less than the periods of the multiple components provided above the region on the central side of the substrate 10.

Figure 4:
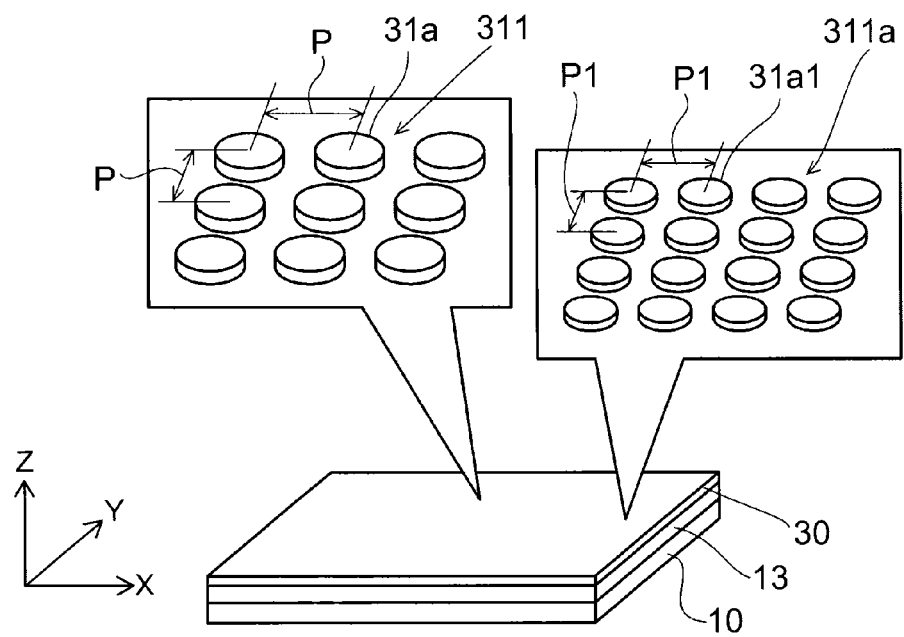
FIG. 4 is a schematic view illustrating the case where the periodicity of the multiple components of the periodic structure units is changed according to the region of the substrate.

FIG. 4 is a schematic view illustrating the case where the periodicity of the multiple components of the periodic structure units is changed according to the region of the substrate. The periodic structure units include multiple components having dot configurations.

As illustrated in FIG. 4, the multiple components 31a having circular columnar configurations are disposed periodically in the periodic structure unit 311 provided above the region on the central side of the substrate 10. Multiple components 31a1 having circular columnar configurations are disposed periodically in a periodic structure unit 311a provided above the region on the circumferential edge side of the substrate 10.

The period is different between the multiple components 31a and the multiple components 31a1.

For example, a disposition pitch dimension P1 of the multiple components 31a1 is less than a disposition pitch dimension P of the multiple components 31a. The size of the multiple components 31a1 is smaller than the size of the multiple components 31a.

For example, the disposition pitch dimension P of the multiple components 31a is 0.17±0.2 μm at the color filter 20B, 0.25±0.2 μm at the color filter 20G, and not less than 0.15 μm and not more than 0.35 μm at the color filter 20R.

The disposition pitch dimension P1 of the multiple components 31a1 may satisfy the following Formula (2).

$$P1 = P \cdot \cos\theta \quad (2)$$

where P1 is the disposition pitch dimension of the multiple components 31a1, P is the disposition pitch dimension of the multiple components 31a, and θ is the incident angle of the light.

Although the case where the periodic structure units include the multiple components 31a (the case of the multiple components having dot configurations) is illustrated as an example, Formula (2) also can be applied to the case where the periodic structure units include the multiple components 31c having stripe configurations and the case where the periodic structure units include the multiple components 31b having hole configurations.

Figure 5A:
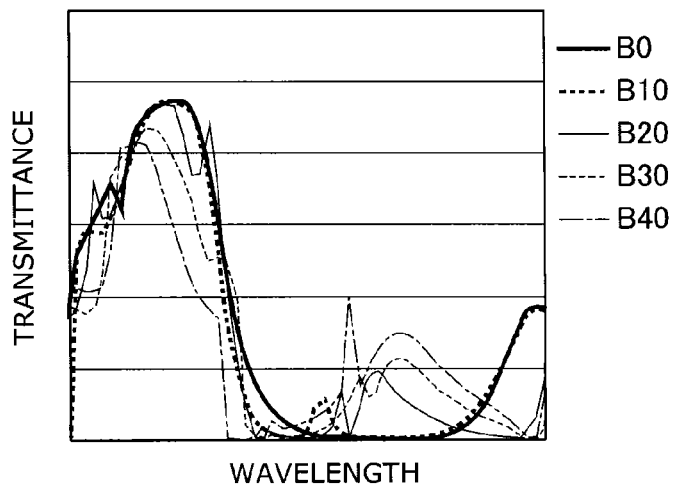
FIGS. 5A to 5C are schematic graphs illustrating effects of changing the periodicity of the multiple components of the periodic structure units according to the region of the substrate.
Figure 5B:
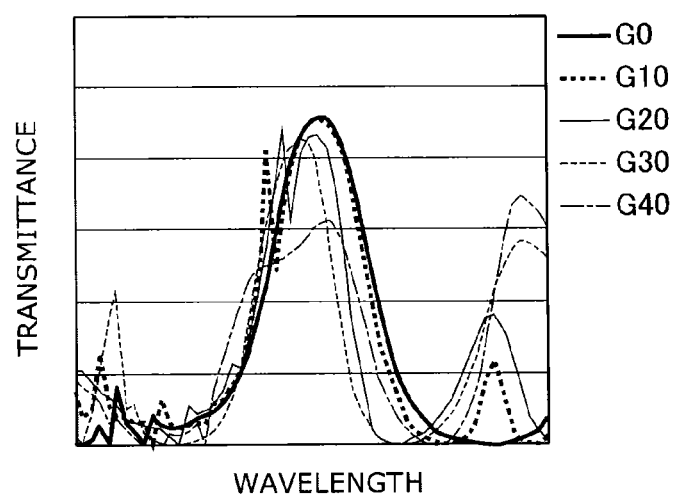
Figure 5C:
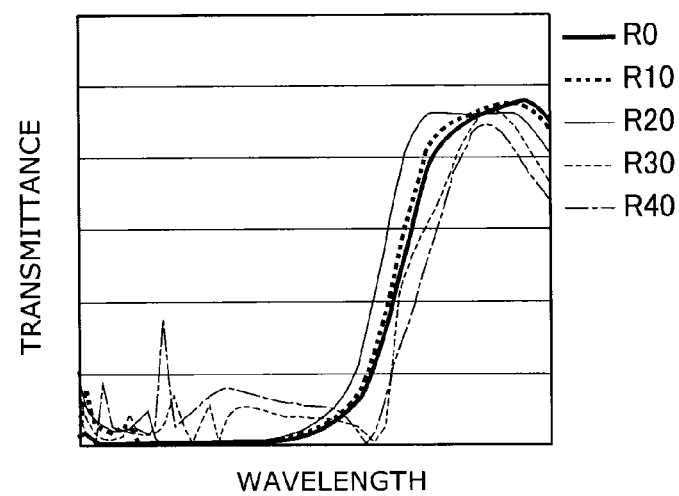

FIGS. 5A to 5C are schematic graphs illustrating effects of changing the periodicity of the multiple components of the periodic structure units according to the region of the substrate. Namely, these graphs are schematic graphs illustrating the effect of the case illustrated in FIG. 4. FIG. 5A is the case of the light of the blue band; FIG. 5B is the case of the light of the green band; and FIG. 5C is the case of the light of the red band.

B0, G0, and R0 are the case where the incident angle θ is 0°; B10, G10, and R10 are the case where the incident angle θ is 10°; B20, G20, and R20 are the case where the incident angle θ is 20°; B30, G30, and R30 are the case where the incident angle θ is 30°; and B40, G40, and R40 are the case where the incident angle θ is 40°.

The incident angle θ is the angle between the direction (the Z direction) perpendicular to the major surface of the substrate 10 and the direction of the incident light. For example, in the case where the incident angle θ is 0°, the light is incident from the direction perpendicular to the major surface of the substrate 10.

The transmittance was determined by a simulation using RCWA.

As illustrated in FIGS. 5A to 5C, the change of the wavelength at which the transmittance is a maximum due to the change of the incident angle θ of the light can be suppressed. In other words, the occurrence of the color shift due to the change of the incident angle θ of the light can be suppressed.

Herein, in the case where the periodic structure unit 313 includes the multiple components 31c having stripe configurations disposed periodically, the periodicity is different according to the incident direction of the light.

Figures 6A, 6B:
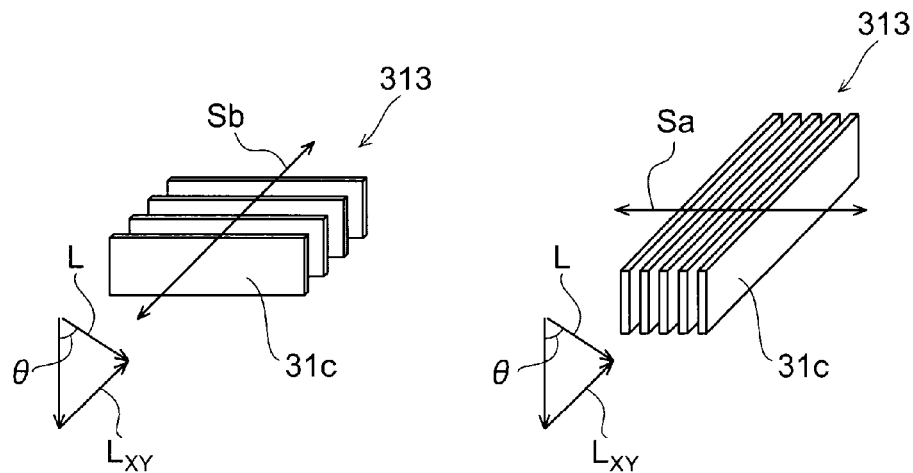
FIGS. 6A and 6B are schematic views illustrating the relationship between the incident direction of the light and the periodicity.

FIGS. 6A and 6B are schematic views illustrating the relationship between the incident direction of the light and the periodicity.

FIG. 6A is the case where a disposition direction Sb of the multiple components 31c having stripe configurations is parallel to the direction of a component Lxy of incident light L in a direction parallel to the major surface of the substrate 10. In other words, this is the case where the direction of the component Lxy of the incident light L is orthogonal to the direction in which the multiple components 31c having stripe configurations extend.

FIG. 6B is the case where a disposition direction Sa of the multiple components 31c having stripe configurations is orthogonal to the direction of the component Lxy of the incident light L in the direction parallel to the major surface of the substrate 10. In other words, this is the case where the direction of the component Lxy of the incident light L is parallel to the direction in which the multiple components 31c having stripe configurations extend.

In FIG. 6A, the periodic structure unit 313 has periodicity with respect to the direction of the component Lxy of the incident light L. In such a case, the size of the component Lxy changes as the incident angle θ of the incident light L changes. Therefore, in FIG. 6A, there is a risk that the suppression effect of the color shift may decrease because the resonance effect changes with the incident angle θ.

On the other hand, in FIG. 6B, the periodic structure unit 313 does not have periodicity with respect to the direction of the component Lxy of the incident light L. In such a case, the size of the component Lxy changes as the incident angle θ of the incident light L changes. However, the resonance effect does not change even when the size of the component Lxy changes because the periodic structure unit 313 does not have periodicity with respect to the direction of the component Lxy of the incident light L. Therefore, in FIG. 6B, there is little risk that the suppression effect of the color shift may decrease even when the incident angle θ changes.

Figure 7:
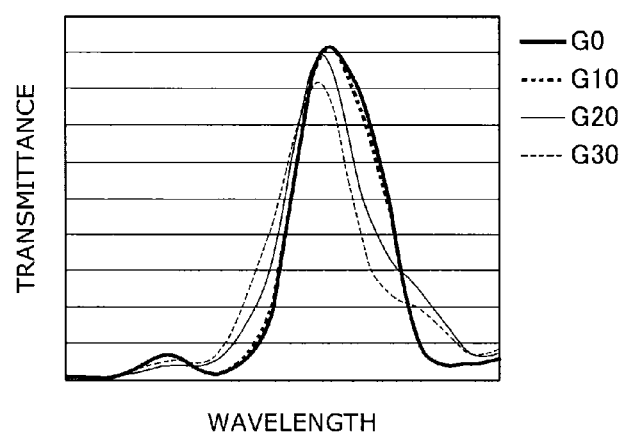
FIG. 7 is a schematic graph illustrating the effect of the case illustrated in FIG. 6B.

FIG. 7 is a schematic graph illustrating the effect of the case illustrated in FIG. 6B.

FIG. 7 is the case of the light of the green band; G0 is the case where the incident angle θ is 0°; G10 is the case where the incident angle θ is 10°; G20 is the case where the incident angle θ is 20°; and G30 is the case where the incident angle θ is 30°.

The incident angle θ is the angle between the direction (the Z direction) perpendicular to the major surface of the substrate 10 and the direction of the incident light. For example, in the case where the incident angle θ is 0°, the light is incident from the direction perpendicular to the major surface of the substrate 10.

The transmittance was determined by a simulation using RCWA.

As illustrated in FIG. 7, the change of the wavelength at which the transmittance is a maximum due to the change of the incident angle θ of the light can be suppressed more than in the case illustrated in FIG. 5B. In other words, the occurrence of the color shift due to the change of the incident angle θ of the light can be suppressed more than in the case illustrated in FIG. 5B.

In such a case, it is sufficient to use a disposition in which the multiple components 31c having stripe configurations extend from the central side of the substrate 10 toward the circumferential edge side of the substrate 10 when viewed in plan such that the periodic structure unit 313 does not have periodicity with respect to the direction of the component Lxy of the incident light L.

Figure 8:
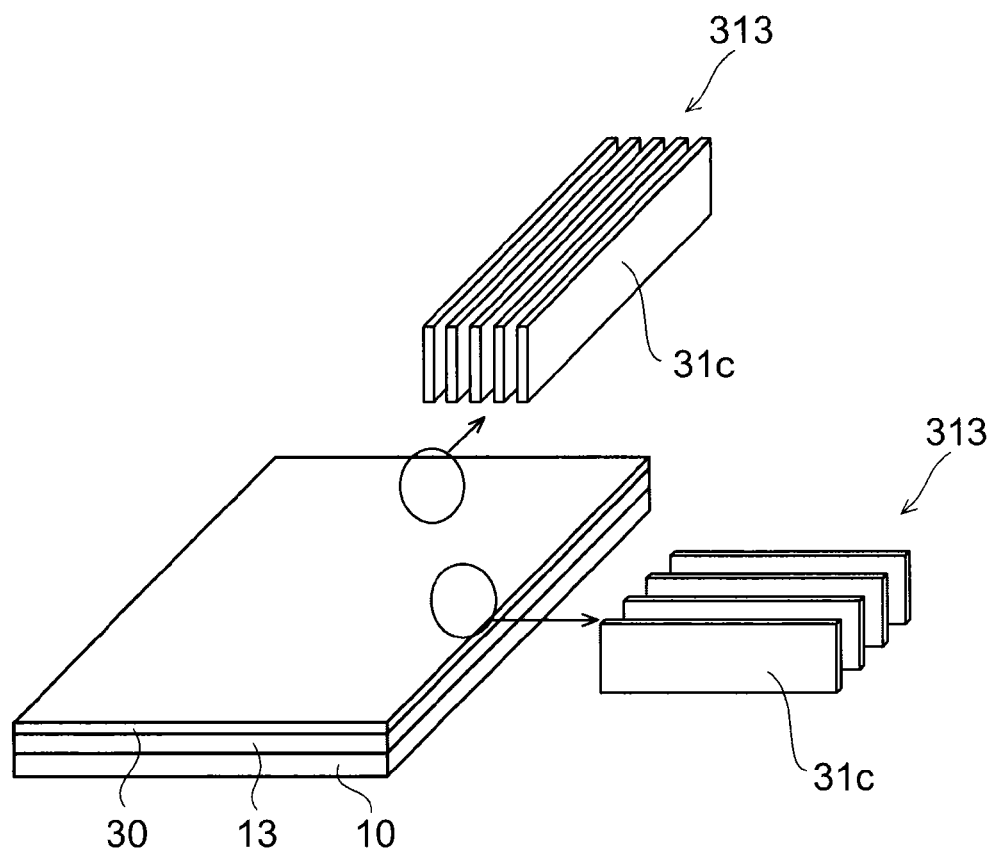
FIG. 8 is a schematic view illustrating the disposition form of the multiple components 31c having stripe configurations.

FIG. 8 is a schematic view illustrating the disposition form of the multiple components 31c having stripe configurations.

As illustrated in FIG. 8, the periodic structure unit 313 does not have periodicity with respect to the direction of the component Lxy of the incident light L by using a disposition in which the multiple components 31c having stripe configurations extend from the central side of the substrate 10 toward the circumferential edge side of the substrate 10 when viewed in plan. Therefore, the occurrence of the color shift due to the change of the incident angle θ of the light can be suppressed further.

Figure 9:
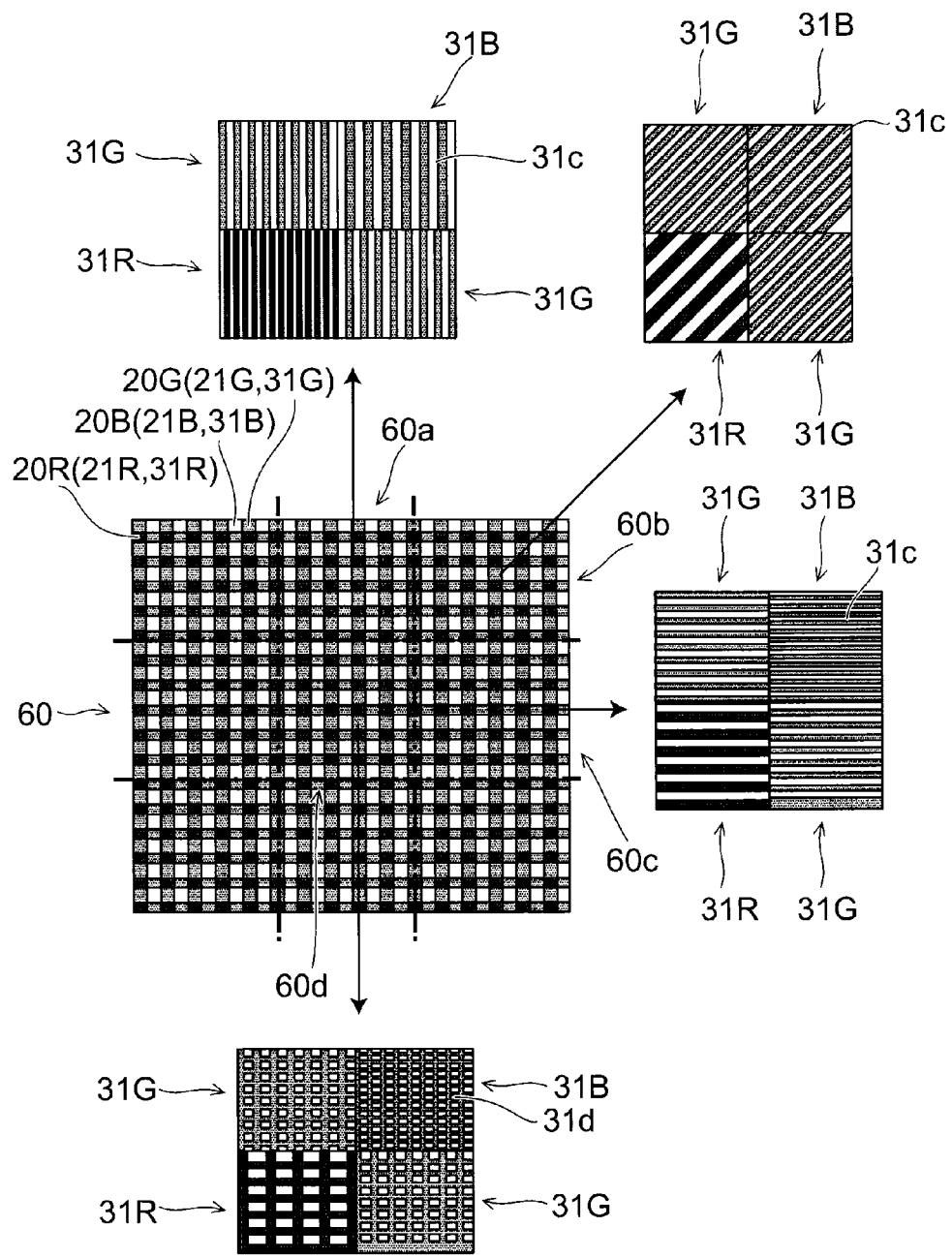
FIG. 9 to FIG. 11 are schematic views illustrating other disposition forms of the multiple components 31c having stripe configurations.
Figure 10:
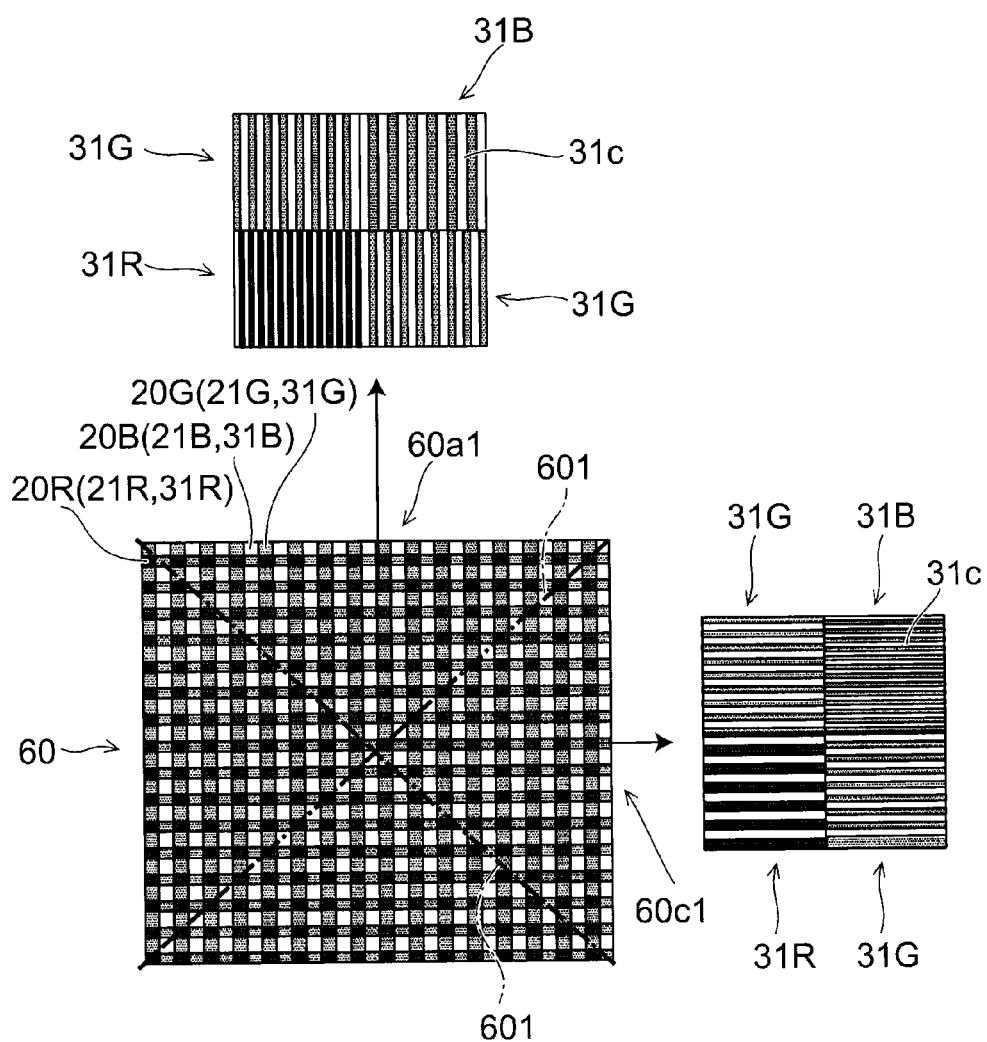
Figure 11:
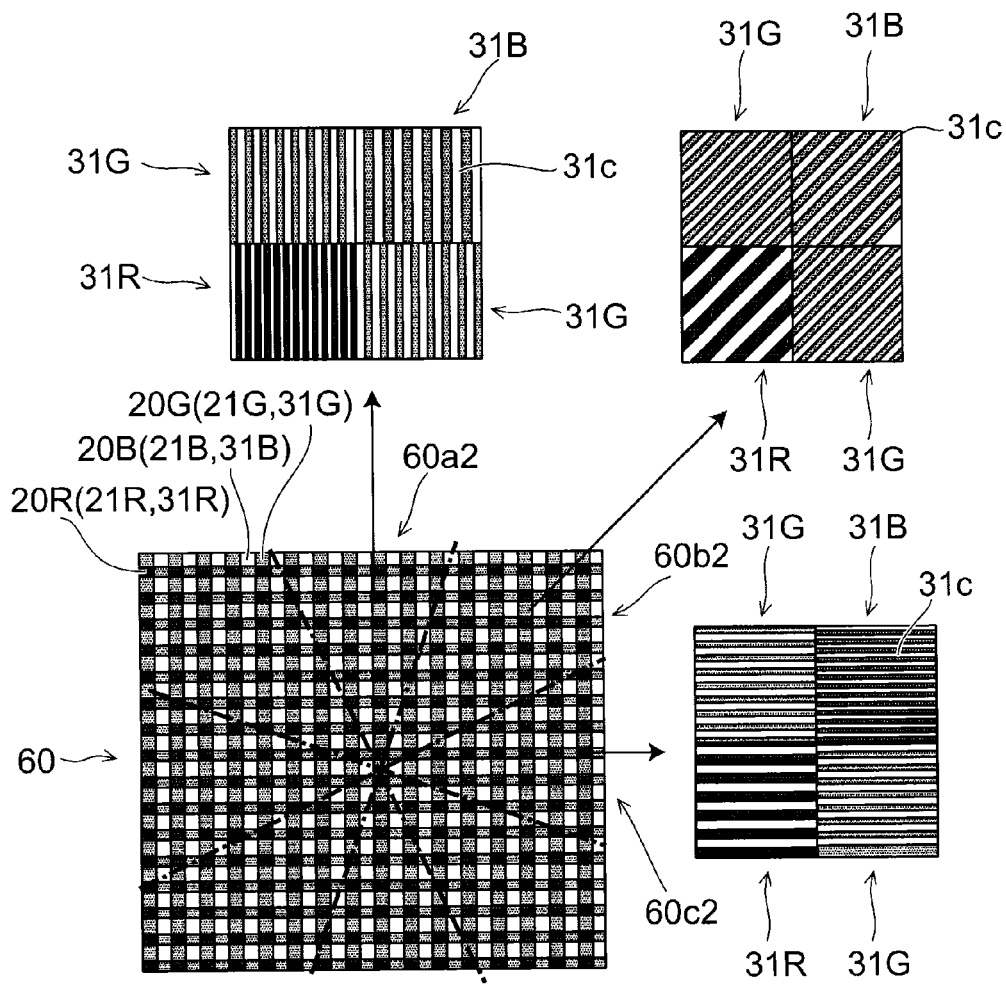

FIG. 9 to FIG. 11 are schematic views illustrating other disposition forms of the multiple components 31c having stripe configurations.

FIG. 9 to FIG. 11 are schematic views illustrating the case where a region 60 where the color filters 20B, 20G, and 20R are provided is subdivided; and the appropriate periodic structure units are provided in each of subdivided regions.

FIG. 9 to FIG. 11 are the case where the color filters 20B, 20G, and 20R are arranged in a Bayer arrangement.

FIG. 9 is the case where the region 60 where the color filters 20B, 20G, and 20R are provided is subdivided into 9 portions.

As described above, the multiple components 31c having stripe configurations provided in the periodic structure units 31B, 31G, and 31R of the color filters 20B, 20G, and 20R are provided to have designated periodicities for the transmitted wavelengths.

By providing the multiple components 31c that have the designated periodicities for the transmitted wavelengths, the light of the designated wavelength bands can be guided into the photodiodes because the light other than the designated wavelength bands is reflected and absorbed.

In regions 60a, 60b, 60c, and 60d, the disposition pitch dimensions of the multiple components 31c having stripe configurations and/or the multiple components 31d having dot configurations decrease toward the circumferential edge of the region 60.

By the disposition pitch dimension of the multiple components 31c and/or the disposition pitch dimension of the multiple components 31d decreasing toward the circumferential edge of the region 60, the increase of the color shift can be suppressed even in the case where the incident angle θ of the light increases.

In this embodiment, the increase of the color shift can be further suppressed by a configuration such as that recited below.

In the regions 60a, 60b, and 60c which are regions on the circumferential edge side of the region 60, a disposition is used in which the multiple components 31c having stripe configurations extend from the central side of the region 60 (the substrate 10) toward the circumferential edge side of the region 60 (the substrate 10) when viewed in plan. For example, a disposition is used in which the multiple components 31c having stripe configurations of the regions 60a and 60c extend in a direction perpendicular to the edge of the region 60. In the region 60b, a disposition is used in which the multiple components 31c having stripe configurations extend in a direction parallel to the diagonal line of the region 60.

By using the disposition in which the multiple components 31c extend from the central side of the region 60 toward the circumferential edge side of the region 60, the periodicity of the periodic structure units with respect to the direction of the component Lxy of the incident light L can be reduced. Therefore, the occurrence of the color shift due to the change of the incident angle θ of the light can be suppressed further.

The multiple components 31d having dot configurations are provided in the region 60d which is the region on the central side of the region 60 (the substrate 10). In such a case, in the region 60d as well, a disposition may be used in which the multiple components 31c having stripe configurations extend from the central side of the region 60 toward the circumferential edge side of the region 60.

Here, the manufacturing of the periodic structure units 31B, 31G, and 31R becomes difficult in the case where the multiple components 31c having stripe configurations are provided in the region 60d which is a region on the central side. On the other hand, the manufacturing of the periodic structure units 31B, 31G, and 31R can be easy in the case where the multiple components 31d having dot configurations are provided in the region 60d.

Therefore, in this embodiment, the multiple components 31d having dot configurations are provided in the region 60d to make the manufacturing of the periodic structure units 31B, 31G, and 31R easy.

FIG. 10 is the case where the region 60 where the color filters 20B, 20G, and 20R are provided is subdivided into 4 portions. FIG. 10 is the case where the subdivision into 4 portions is performed by diagonal lines 601 of the region 60.

Similarly to the case illustrated in FIG. 9, the multiple components 31c having stripe configurations provided in the periodic structure units 31B, 31G, and 31R of the color filters 20B, 20G, and 20R are provided to have the designated periodicities for the transmitted wavelengths.

In regions 60a1 and 60c1, the disposition pitch dimension of the multiple components 31c decreases toward the circumferential edge of the region 60.

In the regions 60a1 and 60c1 in this embodiment as well, a disposition is used in which the multiple components 31c having stripe configurations extend from the central side of the region 60 (the substrate 10) toward the circumferential edge side of the region 60 (the substrate 10) when viewed in plan. For example, in the regions 60a1 and 60c1, a disposition is used in which the multiple components 31c having stripe configurations extend in the direction perpendicular to the edge of the region 60.

In such a case, a disposition of the multiple components 31c similar to that of the region 60b illustrated in FIG. 9 may be used proximally to the diagonal line 601.

Here, by the disposition of the multiple components 31c proximal to the diagonal line 601 being similar to that of the region 60b, the manufacturing of the periodic structure units 31B, 31G, and 31R becomes difficult. On the other hand, in the case where the disposition of the multiple components 31c is similar within each of the regions 60a1 and 60c1, the manufacturing of the periodic structure units 31B, 31G, and 31R can be easy.

Therefore, in this embodiment, the disposition of the multiple components 31c is similar within each of the regions 60a1 and 60c1 to make the manufacturing of the periodic structure units 31B, 31G, and 31R easy.

FIG. 11 is the case where the region 60 where the color filters 20B, 20G, and 20R are provided is subdivided into 8 portions.

Similarly to the case illustrated in FIG. 9, the multiple components 31c having stripe configurations provided in the periodic structure units 31B, 31G, and 31R of the color filters 20B, 20G, and 20R are provided to have the designated periodicities for the transmitted wavelengths.

In regions 60a2, 60b2, and 60c2, the disposition pitch dimension of the multiple components 31c decreases toward the circumferential edge of the region 60.

In the regions 60a2, 60b2, and 60c2 in this embodiment as well, the disposition is used in which the multiple components 31c having stripe configurations extend from the central side of the region 60 (the substrate 10) toward the circumferential edge side of the region 60 (the substrate 10) when viewed in plan. For example, in the regions 60a2 and 60c2, a disposition is used in which the multiple components 31c having stripe configurations extend in the direction perpendicular to the edge of the region 60. In the region 60b2, a disposition is used in which the multiple components 31c having stripe configurations extend in the direction parallel to the diagonal line of the region 60.

Here, it is favorable to use a disposition in which the multiple components 31c having stripe configurations extend in a radial configuration from the center of the region 60 (the substrate 10) when viewed in plan.

However, by using the disposition in which the multiple components 31c having stripe configurations extend in the radial configuration from the center of the region 60 when viewed in plan, the manufacturing of the periodic structure units 31B, 31G, and 31R becomes difficult. On the other hand, as in the case illustrated in FIG. 9 to FIG. 11, the manufacturing of the periodic structure units 31B, 31G, and 31R can be easy in the case where the disposition of the multiple components 31c has the same configuration within each of the subdivided regions.

In such a case, even in the case where the multiple components 31c having stripe configurations extend in directions crossing the radial direction when viewed in plan, the periodicity of the periodic structure units with respect to the direction of the component Lxy of the incident light L can be reduced if the multiple components 31c extend from the central side of the region 60 (the substrate 10) toward the circumferential edge side of the region 60 (the substrate 10). Therefore, the occurrence of the color shift due to the change of the incident angle θ of the light can be suppressed.

Figure 12:
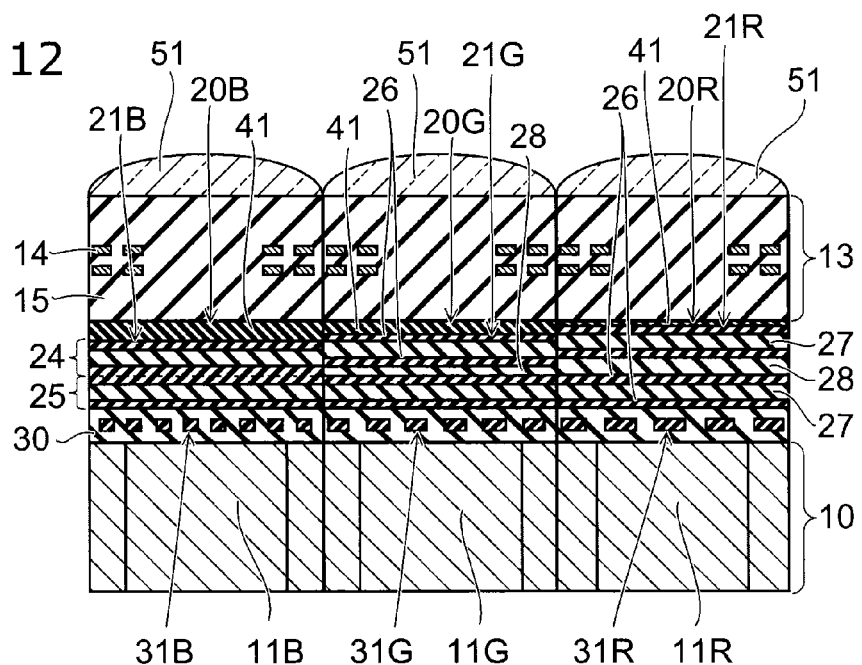
FIG. 12 to FIG. 14 are schematic cross-sectional views illustrating solid-state imaging elements according to other embodiments.
Figure 13:
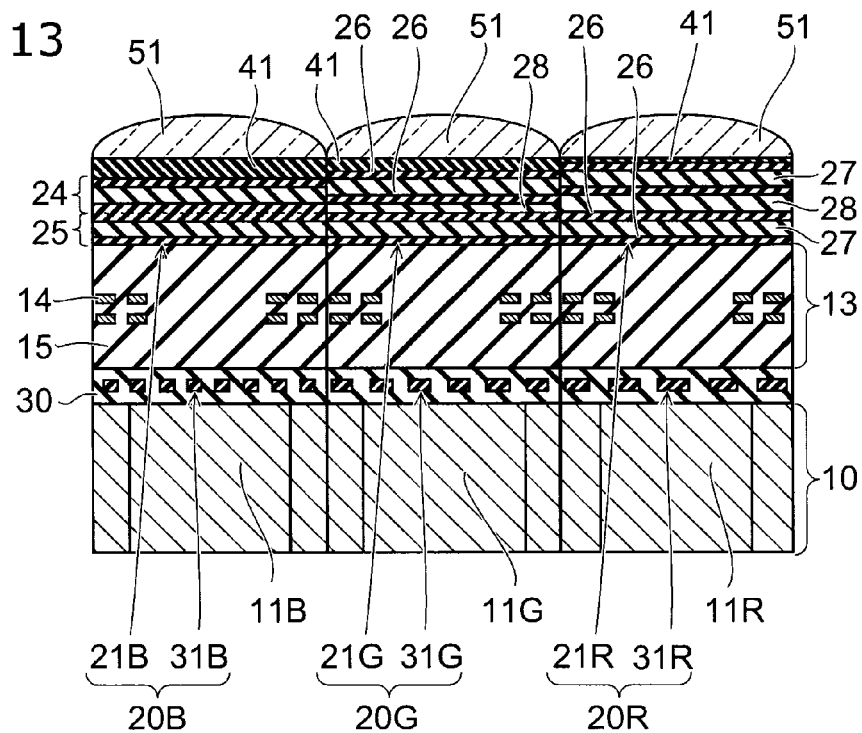
Figure 14:
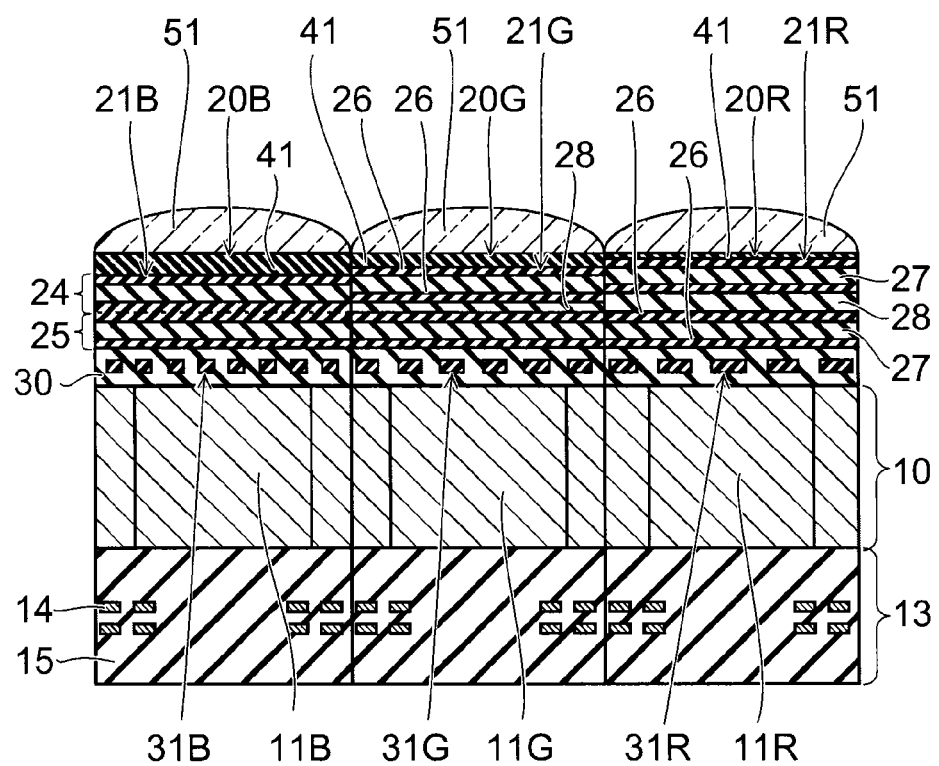

FIG. 12 to FIG. 14 are schematic cross-sectional views illustrating solid-state imaging elements according to other embodiments.

As illustrated in FIG. 12, the color filters 20B, 20G, and 20R may be provided on the substrate 10; and the interconnect layer 13 may be provided on the color filters 20B, 20G, and 20R. In such a case, the microlenses 51 are provided on the interconnect layer 13. The periodic structure units 31B, 31G, and 31R of the color filters 20B, 20G, and 20R are provided on the substrate 10; and the stacked structure units 21B, 21G, and 21R are provided on the periodic structure units 31B, 31G, and 31R.

As illustrated in FIG. 13, the periodic structure units 31B, 31G, and 31R may be provided on the substrate 10; and the interconnect layer 13 may be provided on the periodic structure units 31B, 31G, and 31R. In such a case, the stacked structure units 21B, 21G, and 21R are provided on the interconnect layer 13. The microlenses 51 are provided on the stacked structure units 21B, 21G, and 21R.

As illustrated in FIG. 14, a so-called back-side illuminated structure may be used. The periodic structure units 31B, 31G, and 31R may be provided on the substrate 10; and the stacked structure units 21B, 21G, and 21R may be provided on the periodic structure units 31B, 31G, and 31R. In such a case, the microlenses 51 are provided on the stacked structure units 21B, 21G, and 21R.

In any of the structures illustrated in FIG. 12 to FIG. 14 as well, the suppression of the color shift can be realized by providing the periodic structure units described above.

In the structures illustrated in FIG. 12 to FIG. 14, the periodic structure units 31B, 31G, and 31R are provided on the substrate 10. In the case of such a structure, the cost can be reduced by reducing the number of processes because the periodic structure units 31B, 31G, and 31R can be formed simultaneously with the gate electrodes of the transistors of the peripheral circuit, etc.

According to the embodiments illustrated above, a solid-state imaging element that can suppress the color shift can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A solid-state imaging element, comprising:
a substrate, a plurality of photoelectric conversion units being provided in the substrate; and
a plurality of color filters provided respectively for the plurality of photoelectric conversion units, the plurality of color filters being configured to selectively transmit light of a designated wavelength band,
each of the plurality of color filters including a stacked structure unit and a periodic structure unit, the stacked structure unit and the periodic structure unit being stacked along a first direction, a plurality of layers having different refractive indexes being stacked along the first direction in the stacked structure unit, a plurality of components being provided along a second direction perpendicular to the first direction in the periodic structure unit at different periods according to the designated wavelength band and an incident angle of the light.

2. The element according to claim 1, wherein:
the periodic structure unit includes the plurality of components and a foundation layer; and
a refractive index of the foundation layer is lower than a refractive index of the plurality of components.

3. The element according to claim 2, wherein the plurality of components is provided inside the foundation layer.

4. A solid-state imaging element, comprising:
a substrate, a plurality of photoelectric conversion units being provided in the substrate; and
a plurality of color filters provided respectively for the plurality of photoelectric conversion units, the plurality of color filters being configured to selectively transmit light of a designated wavelength band,
each of the plurality of color filters including a stacked structure unit and a periodic structure unit, a plurality of layers having different refractive indexes being stacked in the stacked structure unit, a plurality of components being provided in the periodic structure unit at different periods according to the designated wavelength band and an incident angle of the light,
wherein the period of the plurality of components provided above a second region of the substrate is less than the period of the plurality of components provided above a first region of the substrate, the incident angle of the light being greater for the second region of the substrate than for the first region of the substrate.

5. A solid-state imaging element, comprising:
a substrate, a plurality of photoelectric conversion units being provided in the substrate; and
a plurality of color filters provided respectively for the plurality of photoelectric conversion units, the plurality of color filters being configured to selectively transmit light of a designated wavelength band,
each of the plurality of color filters including a stacked structure unit and a periodic structure unit, a plurality of layers having different refractive indexes being stacked in the stacked structure unit, a plurality of components being provided in the periodic structure unit at different periods according to the designated wavelength band and an incident angle of the light,
wherein the period of the plurality of components provided above a circumferential edge side of the substrate is less than the period of the plurality of components provided above a central side of the substrate.

6. The element according to claim 4, wherein the plurality of components is provided to satisfy $$P1 = P \cdot \cos \theta$$

where P is a disposition pitch dimension of the plurality of components above the first region of the substrate, P1 is a disposition pitch dimension of the plurality of components above the second region of the substrate, and θ is the incident angle of the light.

7. A solid-state imaging element, comprising:
a substrate, a plurality of photoelectric conversion units being provided in the substrate; and
a plurality of color filters provided respectively for the plurality of photoelectric conversion units, the plurality of color filters being configured to selectively transmit light of a designated wavelength band,
each of the plurality of color filters including a stacked structure unit and a periodic structure unit, a plurality of layers having different refractive indexes being stacked in the stacked structure unit, a plurality of components being provided in the periodic structure unit at different periods according to the designated wavelength band and an incident angle of the light,
wherein a size of the plurality of components provided above a second region of the substrate is smaller than a size of the plurality of components provided above a first region of the substrate, the incident angle of the light being greater for the second region of the substrate than for the first region of the substrate.

8. The element according to claim 1, wherein the plurality of components has one selected from a dot configuration, a stripe configuration, and a hole configuration.

9. A solid-state imaging element, comprising:
a substrate, a plurality of photoelectric conversion units being provided in the substrate; and
a plurality of color filters provided respectively for the plurality of photoelectric conversion units, the plurality of color filters being configured to selectively transmit light of a designated wavelength band,
each of the plurality of color filters including a stacked structure unit and a periodic structure unit, a plurality of layers having different refractive indexes being stacked in the stacked structure unit, a plurality of components being provided in the periodic structure unit at different periods according to the designated wavelength band and an incident angle of the light,
wherein the plurality of components has one selected from a dot configuration, a stripe configuration, and a hole configuration, and
wherein the plurality of components having the stripe configurations extends from a central side of the substrate toward a circumferential edge side of the substrate when viewed in plan.

10. A solid-state imaging element, comprising:
a substrate, a plurality of photoelectric conversion units being provided in the substrate; and
a plurality of color filters provided respectively for the plurality of photoelectric conversion units, the plurality of color filters being configured to selectively transmit light of a designated wavelength band,
each of the plurality of color filters including a stacked structure unit and a periodic structure unit, a plurality of layers having different refractive indexes being stacked in the stacked structure unit, a plurality of components being provided in the periodic structure unit at different periods according to the designated wavelength band and an incident angle of the light,
wherein the plurality of components has one selected from a dot configuration, a stripe configuration, and a hole configuration, and
wherein the plurality of components having the dot configurations is provided above a region on a central side of the substrate.

11. A solid-state imaging element, comprising:
a substrate, a plurality of photoelectric conversion units being provided in the substrate; and
a plurality of color filters provided respectively for the plurality of photoelectric conversion units, the plurality of color filters being configured to selectively transmit light of a designated wavelength band,
each of the plurality of color filters including a stacked structure unit and a periodic structure unit, a plurality of layers having different refractive indexes being stacked in the stacked structure unit, a plurality of components being provided in the periodic structure unit at different periods according to the designated wavelength band and an incident angle of the light,
wherein the plurality of components has one selected from a dot configuration, a stripe configuration, and a hole configuration, and
wherein the plurality of components having the stripe configurations is provided above a region on a circumferential edge side of the substrate.

12. A solid-state imaging element, comprising:
a substrate, a plurality of photoelectric conversion units being provided in the substrate; and
a plurality of color filters provided respectively for the plurality of photoelectric conversion units, the plurality of color filters being configured to selectively transmit light of a designated wavelength band,
each of the plurality of color filters including a stacked structure unit and a periodic structure unit, a plurality of layers having different refractive indexes being stacked in the stacked structure unit, a plurality of components being provided in the periodic structure unit at different periods according to the designated wavelength band and an incident angle of the light,
wherein the plurality of components has one selected from a dot configuration, a stripe configuration, and a hole configuration, and
wherein the plurality of components having the stripe configurations extends parallel to a diagonal line of the substrate when viewed in plan.

13. A solid-state imaging element, comprising:
a substrate, a plurality of photoelectric conversion units being provided in the substrate; and
a plurality of color filters provided respectively for the plurality of photoelectric conversion units, the plurality of color filters being configured to selectively transmit light of a designated wavelength band,
each of the plurality of color filters including a stacked structure unit and a periodic structure unit, a plurality of layers having different refractive indexes being stacked in the stacked structure unit, a plurality of components being provided in the periodic structure unit at different periods according to the designated wavelength band and an incident angle of the light,
wherein the plurality of components has one selected from a dot configuration, a stripe configuration, and a hole configuration, and
wherein the plurality of components having the stripe configurations extends in a radial configuration from a center of the substrate when viewed in plan.

14. The element according to claim 1, wherein the plurality of components includes at least one type selected from the group consisting of silicon, polycrystalline silicon, and silicon oxide.

15. The element according to claim 2, wherein the foundation layer includes at least one type selected from the group consisting of silicon, polycrystalline silicon, and silicon oxide.

16. A solid-state imaging element, comprising:
a substrate, a plurality of photoelectric conversion units being provided in the substrate; and
a plurality of color filters provided respectively for the plurality of photoelectric conversion units, the plurality of color filters being configured to selectively transmit light of a designated wavelength band,
each of the plurality of color filters including a stacked structure unit and a periodic structure unit, a plurality of layers having different refractive indexes being stacked in the stacked structure unit, a plurality of components being provided in the periodic structure unit at different periods according to the designated wavelength band and an incident angle of the light, wherein:
the stacked structure unit includes a lower mirror layer and an upper minor layer provided above the lower mirror layer; and
a structure of the upper mirror layer and the lower minor layer is symmetric in a stacking direction.

17. The element according to claim 16, wherein:
the upper mirror layer includes a stacked structure of a first layer and a second layer; and
a refractive index of the first layer is higher than a refractive index of the second layer.

18. The element according to claim 16, wherein:
the lower minor layer includes a stacked structure of the first layer and the second layer; and
a refractive index of the first layer is higher than a refractive index of the second layer.

19. The element according to claim 16, further comprising a control layer provided between the lower mirror layer and the upper mirror layer.

20. The element according to claim 16, wherein a film thickness of the first layer and a film thickness of the second layer satisfy $$D=\lambda/(4\times n)$$

where D is the film thickness of the first layer or the second layer, $\lambda$ is a center wavelength of a visible region, and n is the refractive index of the first layer or the second layer.

* * * * *